US008748944B2

(12) United States Patent
Daumiller et al.

(10) Patent No.: US 8,748,944 B2
(45) Date of Patent: Jun. 10, 2014

(54) ELECTRIC CIRCUIT WITH VERTICAL CONTACTS

(75) Inventors: Ingo Daumiller, Dietenheim (DE); Ertugrul Soenmez, Ulm (DE); Mike Kunze, Pfaffenhofen (DE)

(73) Assignee: MicroGan GmbH, Ulm (DE)

( * ) Notice: Subject to any disclaimer, the term of this patent is extended or adjusted under 35 U.S.C. 154(b) by 182 days.

(21) Appl. No.: 12/664,318

(22) PCT Filed: Jun. 16, 2008

(86) PCT No.: PCT/EP2008/004838
§ 371 (c)(1),
(2), (4) Date: Apr. 8, 2010

(87) PCT Pub. No.: WO2008/155085
PCT Pub. Date: Dec. 24, 2008

(65) Prior Publication Data
US 2010/0230727 A1 Sep. 16, 2010

(30) Foreign Application Priority Data

Jun. 18, 2007 (DE) .......................... 10 2007 028 458

(51) Int. Cl.
*H01L 27/10* (2006.01)
*H01L 29/74* (2006.01)
*H01L 29/73* (2006.01)
*H01L 23/52* (2006.01)
*H01L 23/48* (2006.01)
*H01L 29/40* (2006.01)

(52) U.S. Cl.
USPC ........... 257/211; 257/207; 257/208; 257/691; 257/758; 257/E21.019

(58) Field of Classification Search
USPC ........... 257/207, 208, 211, 691, 758, E21.019
See application file for complete search history.

(56) References Cited

U.S. PATENT DOCUMENTS

| 4,977,108 | A | * | 12/1990 | Haskell ......................... 438/586 |
| 5,283,558 | A | * | 2/1994 | Chan ............................. 345/168 |
| 5,311,048 | A | * | 5/1994 | Takahashi et al. ............. 257/207 |
| 5,444,275 | A | | 8/1995 | Kugishima et al. ........... 257/206 |
| 5,633,525 | A | | 5/1997 | Kitamura et al. ............. 257/381 |
| 5,985,747 | A | * | 11/1999 | Taguchi ........................ 438/622 |
| 6,331,736 | B1 | * | 12/2001 | Duesman et al. ............. 257/778 |
| 6,489,228 | B1 | * | 12/2002 | Vigna et al. ................... 438/612 |
| 6,509,277 | B1 | * | 1/2003 | Saito et al. .................... 438/723 |
| 6,541,850 | B2 | * | 4/2003 | Duesman et al. ............. 257/691 |

(Continued)

FOREIGN PATENT DOCUMENTS

EP     0 714 128     5/1996

*Primary Examiner* — Ida M Soward
(74) *Attorney, Agent, or Firm* — Fay Kaplun & Marcin, LLP (57) ABSTRACT

An electrical circuit includes at least two unit cells configured on a planar substrate which extends in one plane. The unit cells respectively have at least two contact points with a different function and include at least one dielectric layer disposed on the substrate and/or on the unit cells and at least two contact surfaces which are disposed parallel to the plane above the contact points and/or the substrate. The contact points with the same function are connected electrically to at least one common contact surface for at least a part of the contact points of the same function via at least one through-contacting through the dielectric layer and able to be contacted in common from outside via the corresponding contact surfaces.

27 Claims, 5 Drawing Sheets

(56) References Cited

U.S. PATENT DOCUMENTS

| | | | |
|---|---|---|---|
| 7,122,830 B2* | 10/2006 | Ishikawa et al. | 257/59 |
| 7,205,637 B2* | 4/2007 | Koike | 257/620 |
| 7,662,722 B2* | 2/2010 | Stamper et al. | 438/719 |
| 7,737,025 B2* | 6/2010 | Myers et al. | 438/637 |
| 7,977,763 B2* | 7/2011 | Lin et al. | 257/516 |
| 8,008,776 B2* | 8/2011 | Lee et al. | 257/759 |
| 2001/0022398 A1* | 9/2001 | Grill et al. | 257/758 |
| 2003/0025579 A1 | 2/2003 | Christensen | 333/213 |
| 2004/0248339 A1* | 12/2004 | Lung | 438/102 |
| 2008/0122096 A1* | 5/2008 | Feilchenfeld et al. | 257/758 |
| 2009/0309224 A1* | 12/2009 | Lin et al. | 257/758 |
| 2011/0198589 A1* | 8/2011 | Lin et al. | 257/48 |

\* cited by examiner

ELECTRIC CIRCUIT WITH VERTICAL CONTACTS

FIELD OF INVENTION

The invention relates to an electrical circuit having at least two unit cells, such as for example transistors or diodes, which can be contacted together in a plane in which the unit cells are not disposed. The invention relates in addition to a semiconductor component having such an electrical circuit and also to a method for producing an electrical circuit in which at least two unit cells are contacted in this way.

BACKGROUND INFORMATION

Electrical circuits can be constructed from two or more unit cells. Such unit cells can be for example diodes, transistors or other electronic components. These components can be configured on a common substrate. It is advantageous for many applications if several or even all of the unit cells on an electrical circuit can be contacted in common from outside. Thus for example a plurality of transistors can be connected together and can act like a transistor with a larger surface area. For this purpose, a source contact, a drain contact and a gate contact would then be contacted in common from outside. Correspondingly, a plurality of diodes can be connected in parallel and then act like a diode with a larger surface area. The contacts can hereby be configured as contact points on the common substrate.

According to the state of the art, contacts of various unit cells with the same function are connected to each other via buses and can be contacted from outside at these buses. For this purpose, the buses can have a bonding spot or be in connection with one such on which a bonding wire can be disposed.

According to the state of the art, these buses are disposed in a plane in which the contact points of the unit cells are disposed and are connected in this plane to all of the contact points of the same function. Bonding spots for external contacting are also disposed in the plane of the buses and of the contact points.

However, it is disadvantageous with such an arrangement that both the buses and possibly the bonding spots take up too much room on the substrate on which the unit cells and the electrical circuit are configured. This substrate surface is very expensive in particular in semiconductor technology. Furthermore, the spatial requirement on the substrate increases further with an increasing number of unit cells since the buses require a certain minimum width on the substrate in order to keep their internal resistance sufficiently low. The width of the buses therefore increases with the current to be conducted.

SUMMARY OF INVENTION

The present invention relates to an electric circuit with a plurality of unit cells which can be produced more economically but which enables an extensively arbitrary increase in the number of unit cells without thereby allowing the occurring power loss and the spatial requirement on a substrate to increase too greatly.

An electrical circuit having at least two unit cells which have respectively at least two contact points with respectively one specific function is according to the invention. There should hereby be understood by a unit cell an electronic component. A unit cell can hereby be in particular an ultrasmall functional unit, as can be produced as such from semiconductors. A unit cell can be in particular also a semiconductor heterostructure or a component based on such. Examples are, inter alia, a diode, a transistor, a resistor, a capacitor and an inductance. Also a plurality of identical or different ones of these and/or other components, which are connected to each other, can form one unit cell.

The unit cells respectively have at least two contact points with a specific function. This function is that function which the contact point in the corresponding component has. The function of a contact can therefore be, inter alia, the function positive pole, negative pole, earth, source, drain, gate, collector, emitter, base, and be a corresponding function for other components.

At least a part of the mentioned contact points are now disposed in a common plane. According to the invention, at least for two of the functions present in the occurring components, the contact points of different unit cells with the same function can be contacted in common from outside. The common contacting of the contact points of the same function from outside is hereby effected via respectively at least one contact surface which is situated parallel to the plane, in which the mentioned contact points are disposed, above this plane. Via the respective contact surface, a plurality of contact points of different but preferably similar unit cells can therefore be contacted in common from outside. The circuit according to the invention therefore has at least two contact surfaces which have a different function or contact contact points of two different functions. The contact surfaces are connected electrically to the corresponding contact points via at least one through-contacting. There is understood here by through-contacting any arrangement which produces an electrical contact. In particular the conductive layers described in more detail further on are advantageously a component of the through-contacting.

Advantageously, all the contact points occurring in the electrical circuit are disposed in one plane or at least all the contact points of at least one type of unit cells. In a particularly preferred embodiment, the contact points have an oblong configuration on a substrate. The oblong contact points are preferably disposed parallel to each other for at least two different functions. Contact points of further functions can likewise be disposed parallel to these contact points. The substrate is preferably conductive or semiconducting.

In a particularly preferred embodiment, the contact points of at least one function have an oblong configuration and are annularly closed. There are understood by oblong contact points here contact points which extend along a line and, in one or two directions perpendicular to this line, have an essentially constant or only slightly changing extension over the length of the line. In a preferred embodiment, the contact points are closed in their longitudinal direction, this means that the mentioned line along which the electrodes extend is a closed line for the corresponding electrodes. Closed hereby means that the line or the contact point along the longitudinal direction thereof merges into itself, i.e. has no beginning and no end. The contact points can hereby be configured such that their surfaces enclose a free region which is not covered by the corresponding contact point. The contact points can hereby be closed in the mentioned manner annularly, circularly, elliptically, rectangularly, squarely, triangularly, polygonally or in another manner. The contact point then hereby extends along the edges of the corresponding shape, preferably parallel to the plane of the substrate.

Preferably, the contact points are disposed in their longitudinal direction parallel to the substrate and/or parallel to each other. Preferably, the contact points of different functions are in addition separated from each other or insulated electrically. Parallelism here means that the shortest spacing of the parallel objects relative to each other is constant and/or is the same on the total extension or length.

The contact points can also be termed electrodes or be electrodes. They can be configured to be non-blocking relative to the substrate, i.e. as an ohmic contact, or blocking, i.e. as a Schottky contact.

There are possible preferably as semiconductor materials inter alia which contain or comprise at least one nitride of a main group III element. These materials can therefore be inter alia GaN, AlN, InN, GaAlN, GaInN, AlInN and/or AlInGaN. These materials have inter alia the advantage that, with them, circuits can be produced which are particularly resistant to high temperatures, in particular to temperatures $\geq 100°$ C., particularly preferred $\geq 300°$ C., particularly preferred $\geq 500°$ C., particularly preferred $\geq 700°$ C.

Preferably, the electrical circuit is produced in that, between the unit cells and at least one of the contact surfaces, at least one dielectric layer is disposed, which layer has at least one opening through which at least a part of the contact points are contacted electrically with the contact surface via which they can be contacted in common. The dielectric layer is hereby preferably disposed parallel to the plane in which the contact points are disposed. In particular, this layer is preferably also disposed directly on the contact points and/or the unit cells. The mentioned openings are preferably disposed in the plane of the dielectric layer, i.e. extend from the side of the dielectric layer orientated towards the contact surfaces to that upper side which is opposite the latter and orientated towards the unit cells. Through these openings, at least a part of the contact points, preferably all of the contact points, are hereby in contact electrically with that contact surface which connects the contact points of the corresponding function to each other and via which these contact points can be contacted in common from outside. The corresponding contact surfaces can hereby be disposed directly above the mentioned openings and also extend into these openings such that they contact the contact points situated under the openings, however it is also possible that, between the mentioned dielectric layer and the contact surfaces, further structures are disposed which produce or impart the electrical contact between the contact points and the contact surfaces.

In particular if the contact surfaces are not disposed directly on the mentioned dielectric layer, it is preferred that, on that surface of the mentioned dielectric layer, orientated away from the unit cells, at least one conductive layer is disposed, which conductive layer extends over at least one region of the surface of the dielectric layer and which extends into the at least one opening in the dielectric layer such that it is in electrical contact with a conductive layer which is disposed under the dielectric layer, or with at least one of the contact points, preferably with the contact points of a specific function. This conductive layer can be applied directly on the dielectric layer, however also intermediate layers are conceivable. The conductive layer can extend into the openings in that it fills the openings completely or partially. However, it is also possible that the conductive layer is disposed only on the surface of a wall of the opening and also on the surface of the material situated under the opening. The conductive layer therefore follows the surface of the dielectric layer, the wall of the opening and also the part, situated under the opening, of the layer situated under the dielectric layer.

The electrical contacting through the opening can be produced in turn also by separate via contacts. Such via contacts are therefore in electrical contact below the dielectric layer with the conductive layer disposed there or with the contact points or they contact these and contact correspondingly the first conductive layer on the upper side of the dielectric layer.

The above-described layer sequence comprising at least one dielectric layer and also at least one conductive layer can be repeated several times, for example with a second and a third dielectric layer and/or a second or a third conductive layer. In this way, contact points of a large number of individual cells with two, three, four or more different functions can be contacted in common via a number of contact surfaces corresponding to the number of functions. The contact surfaces can hereby be disposed continuously in a common plane and hereby cover in particular a surface of the electrical circuit. For particular preference, the contact surfaces cover an upper surface of the circuit, which is orientated away from the unit cells, as completely as possible. However, between the contact surfaces, a certain spacing can hereby be present in order to produce electrical insulation, which spacing can also be filled with dielectric material. The shape of the electrical circuit preferably corresponds to the shape of an underlying substrate which is preferably the substrate on or from which the unit cells can be formed. Electrical circuits and/or substrate can hereby be for example square, rectangular or circular. If the electrical circuit is rectangular then the contact surfaces can likewise preferably be rectangular. If the electrical circuit is circular, then the contact surfaces can be configured as sectors of the circular surface area which is defined by the electrical circuit.

In particular for diodes and/or transistors, an embodiment of the electrical circuit is preferred in which the contact points of different functions are disposed in one plane. A first dielectric layer which has at least one opening above each of the contact points is hereby preferably disposed above the contact points. A first conductive layer is preferably disposed on this first dielectric layer and has at least one region for each of the different functions, the different regions of the first conductive layer being insulated from each other electrically. The first conductive layer extends in the regions into the openings such that it is in electrical contact with the contact points of the corresponding function. The contacting through the opening can hereby be configured as described above. The electrical contacting through the opening can be produced in turn also by separate via contacts. Via contacts of this type are therefore in electrical contact below the dielectric layer with the conductive layer or with the contact points disposed there or contact these and contact correspondingly the first conductive layer on the upper side of the dielectric layer.

Preferably, the regions of a conductive layer are hereby disposed in one plane. On the first conductive layer, preferably a second dielectric layer is now disposed, which covers at least two regions of the first conductive layer, corresponding to the various functions, at least in regions. This second dielectric layer has in turn at least one opening to the regions of the first conductive layer which are covered by it and through which opening the first conductive layer can be contacted from that side of the second dielectric layer orientated away from the first conductive layer. Preferably, at least one second conductive layer with preferably different separate regions is disposed on the second dielectric layer, which second conductive layer is in electrical contact through the openings in the second dielectric layer with respectively one of the regions of the first conductive layer situated thereunder. This contacting can be produced in turn by direct contact or also via a via contact.

In particular if the unit cells have more than two different functions, it is particularly preferred that a third dielectric layer is disposed on the second conductive layer, which third dielectric layer in turn has at least one opening through which at least one region of the second conductive layer can be contacted. On the third dielectric layer, a third conductive layer or at least one contact surface can then be disposed, which contacts, with at least one region, at least one region of the second conductive layer through the at least one opening in the third dielectric layer. It is possible in a particularly advantageous manner, due to the above-described arrangement, to contact in common an unlimited large number of preferably similar unit cells with contacts of two or three different functions via one contact surface for each function.

The mentioned openings in all of the described dielectric layers can have different geometries. The openings can be cylindrical with a circular, rectangular or otherwise shaped cross-section on the upper and the lower side of the corresponding dielectric layer. However, also oblong openings are particularly preferred which extend longitudinally, in particular in the case of oblong contact points or oblong electrodes, at least in portions parallel to the contact points or electrodes.

A particularly preferred embodiment provides that the substrate and the electrical circuit are circular. For particular preference, at least some of the contact points are hereby circular-ring shaped or configured as portions of circular rings and disposed parallel to each other. The mentioned openings in dielectric layers are hereby likewise preferably configured as portions of circular rings and extend parallel to the contact points. The contact surfaces are preferably configured as sectors of the circular surface of the circuit.

Preferably, one or more of the contact surfaces have respectively at least one bonding spot on which at least one bonding wire is disposed for particular preference.

The above-described dielectric and/or conductive layers and/or contact surfaces preferably have a planar configuration such that they can be produced in coating methods. They can therefore preferably be coatings of the surface or layer respectively situated thereunder.

A semiconductor component with an electrical circuit as described above is also according to the invention. The electrical circuit can hereby also be the semiconductor component.

Furthermore, a method for producing an electrical circuit which preferably has one or more above-described features is in addition according to the invention.

According to the invention, an electrical circuit with at least two unit cells is produced, the unit cells having respectively at least two contact points with respectively one specific function.

A first dielectric layer with openings is hereby produced on the surface of a substrate and/or on the contact points such that the contact points can be contacted electrically through the openings. On the first dielectric layer, at least one first conductive layer with regions separated electrically for at least two of the functions is now produced and contacts the contact points of the corresponding function in the regions.

Preferably a second dielectric layer with openings is applied at least in regions on the first conductive layer such that the regions of the first conductive layer, which are covered by the second dielectric layer, can be contacted through the openings. On the second dielectric layer, preferably a second conductive layer is now produced with at least one region which is in electrical contact in each region with the region of the first conductive layer with the corresponding function through at least a part of the openings. This method can be repeated analogously with a third dielectric layer and a third conductive layer disposed thereon or correspondingly a contact surface so that an electrical circuit with individual cells, a first dielectric layer disposed thereon and a first conductive layer disposed on the latter, a second dielectric layer disposed on the first conductive layer and a second conductive layer which is disposed on this second dielectric layer and on which in turn a third dielectric layer is disposed, can be produced with the contact surfaces at the very top. On the uppermost conductive layer or contact surface, i.e. the one furthest away from the unit cells, preferably at least one bonding spot and/or at least one bonding wire is disposed, via which the electrical circuit can be contacted from outside.

In a particularly convenient embodiment, the electrical circuit can have contacts of different functions, which are disposed adjacently such that, adjacent to a contact of one function, a contact of another function is always or repeatedly situated. Such a circuit can be for example a half or whole H-bridge. A half H-bridge has two transistors connected in series, a whole H-bridge has two half H-bridges which are connected to each other via a consumer which is in connection with the contacts which are connected in the H-bridges to the respectively other transistor.

The dielectric layers, the conductive layers and/or the contact surfaces are preferably produced in coating methods, as is normal in semiconductor technology.

BRIEF DESCRIPTION OF DRAWINGS

The invention is intended to be explained subsequently with reference to some Figures, by way of example.

There are shown

DETAILED DESCRIPTION

Figure 1:
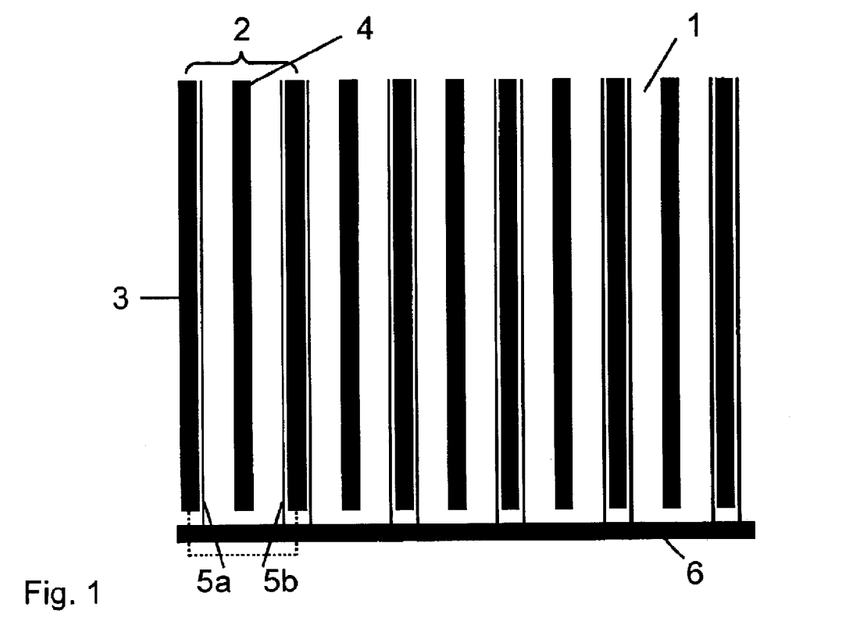
FIG. 1 a section of a semiconductor component with a large number of transistors as unit cells, FIG. 2 an electrical circuit with the semiconductor component according to FIG. 1 on which a dielectric layer with openings is disposed, FIG. 3 a structure corresponding to FIG. 2 with a conductive layer disposed on the dielectric layer, FIG. 4 a structure corresponding to FIG. 3 with a second dielectric layer applied on the very top with a large number of openings, FIG. 5 a structure corresponding to FIG. 4 with a second conductive layer applied on the very top, FIG. 6 a structure corresponding to FIG. 5 with a third dielectric layer disposed thereon with a large number of openings, FIG. 7 a structure corresponding to FIG. 6 with two contact surfaces, FIG. 8 an entire arrangement which is constructed as in the sections in FIGS. 1 to 7, and FIG. 9 a cross-section through the structure shown in FIG. 8.

FIG. 1 shows a substrate 1 having a large number of unit cells 2 which are disposed thereon and here are transistors. FIG. 1 corresponds to the section 81 shown in FIG. 8 taken from a corner of a square component. These transistors respectively have a source contact 3, a drain contact 4 and also two gate contacts 5a, 5b. The gate contacts 5a, 5b are connected via a common contact 6 or bus 6.

The gate contact 6 (bus) can also be contacted directly by a strip contact. However, it is preferred for reasons of flatness to contact the bus 6 analogously to the other contacts by means of a separate contact surface. As a result, the contact surface of the gate can also be enlarged without requiring to enlarge the substrate.

Two adjacent transistors respectively share one source contact 3. The source—3, drain—4 and gate—5a, 5b contacts are oblong here and disposed parallel to each other. Source contacts 3 and drain contacts 4 respectively have the same spacing relative to each other. The gate contacts 5a, 5b are disposed close to the source contacts. The contact points 2, 3 and 4 are disposed here in a common plane.

Figure 2:
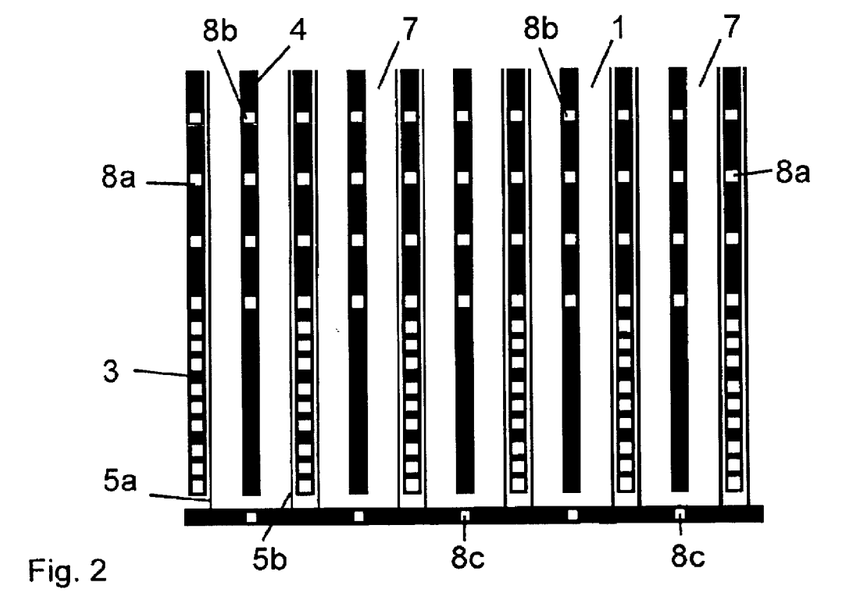

FIG. 2 shows the arrangement shown in FIG. 1 with a first dielectric layer 7 disposed thereon. This dielectric layer 7 has openings 8a, 8b, 8c above the contact points 3, 4, 5a, 5b. Through these openings 8a, 8b, 8c, the contact points 3, 4, 5a, 5b can be contacted electrically, for example by a first via contacting or through-contacting. The dielectric layer 7 in the illustrated example is disposed directly on the substrate and on the contact points 3, 4, 5a, 5b and parallel to the surface of the substrate 1.

Figure 3:
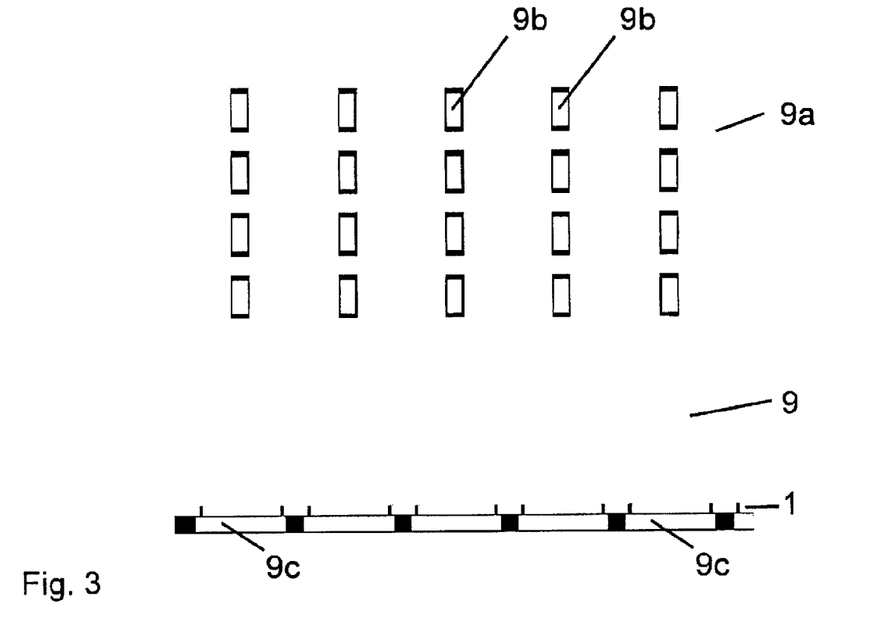

FIG. 3 now shows a structure corresponding to FIG. 2, a first conductive layer 9 or first metallisation 9 being disposed on that surface of the structure orientated away from the substrate 1. This conductive layer 9 has regions for different functions. The region 9a is hereby in electrically conductive connection through the openings 8a with the source contact point 3. The regions 9b (a large number of partial regions 9b with the same function) are in electrically conductive connection with the drain contact points 8b and are separated electrically from the region 9a. The regions 9c are finally in electrically conductive connection with the gate contact point 8c. Also the regions 9c are separated electrically from the region 9 and from the regions 9b.

Figure 4:
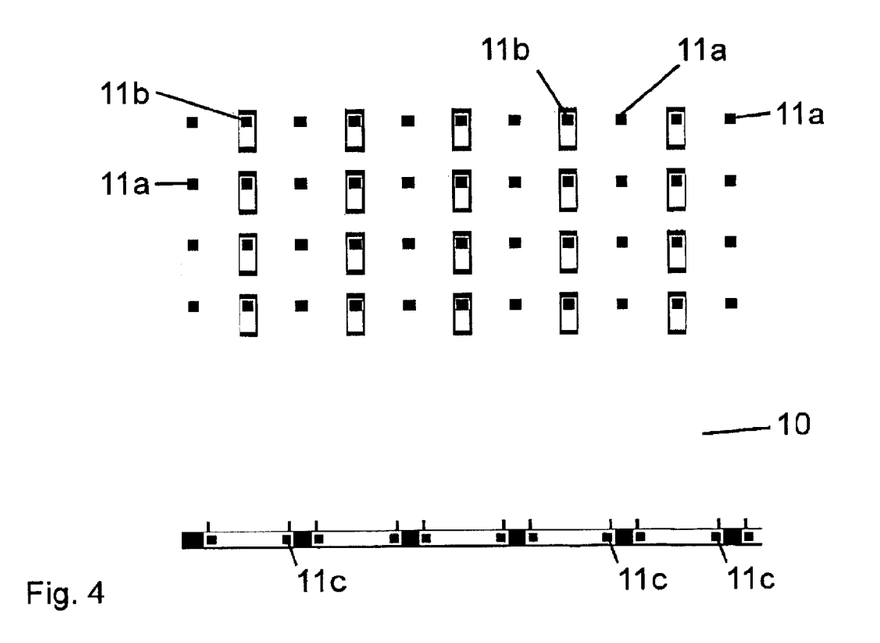

FIG. 4 now shows a structure corresponding to FIG. 3, a second dielectric layer 10 being disposed on the first conductive layer 9. This dielectric layer 10 has in turn a large number of openings 11a, 11b, 11c through which the region 9a, 9b or 9c of the first conductive metal layer 9, which is situated thereunder, can be contacted.

Figure 5:
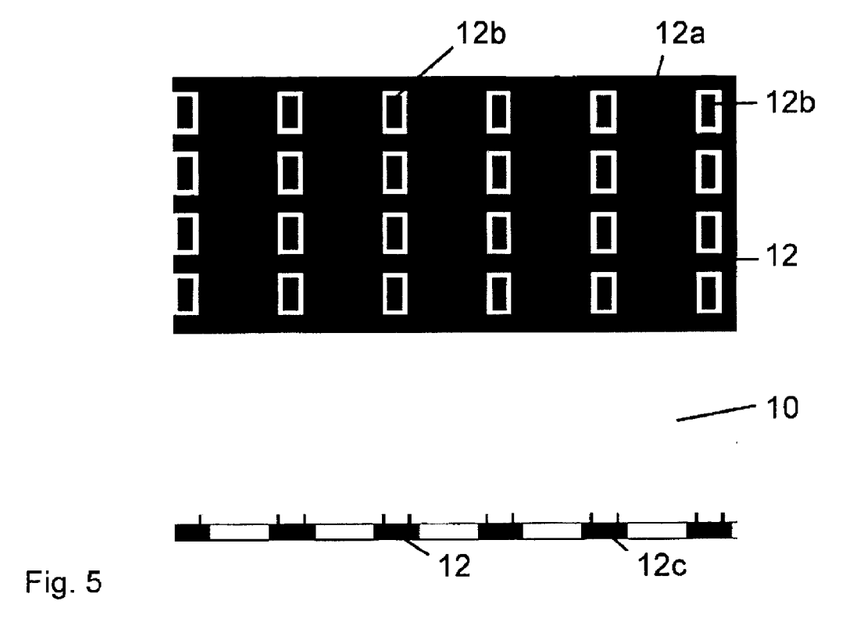

FIG. 5 shows a structure corresponding to FIG. 4, a second conductive layer 12 with two regions 12a, 12b being applied on a part of the second dielectric layer 10. The regions 12a of the conductive layer 12 hereby contact the regions 9b of the first electrical layer 9 through the openings 11b. These regions are therefore assigned to the drain contacts 8b or are connected electrically to these. The regions 12b of the second electrically conductive layer 12 contact the regions 9a of the first conductive layer 9 via the openings 11a and are therefore in electrical contact with the source contacts 8a.

The regions 12b are a large number of partial regions 12b which are separate from each other electrically and contact the contacts of the same function. They are connected to each other electrically via the conductive layer 9.

The conductive regions 9c shown in FIG. 3 are contacted by the regions 12c of the conductive layer 12 via the openings 11c. Also the regions 12c are hereby partial regions which are separated from each other electrically and have the same function, here the gate function.

Figure 6:
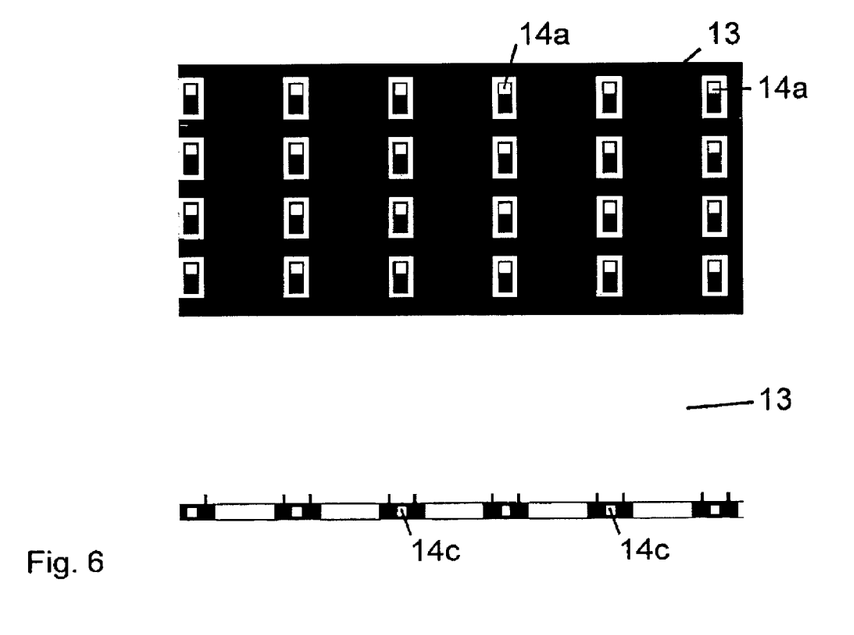

FIG. 6 shows a structure corresponding to FIG. 5, a further dielectric layer 13 now being applied on this structure. This dielectric layer 13 has in turn a large number of openings 14a, 14c through which the conductive regions 12b, 12c situated thereunder can be contacted electrically, for example by a through-contacting or via contacting.

Figure 7:
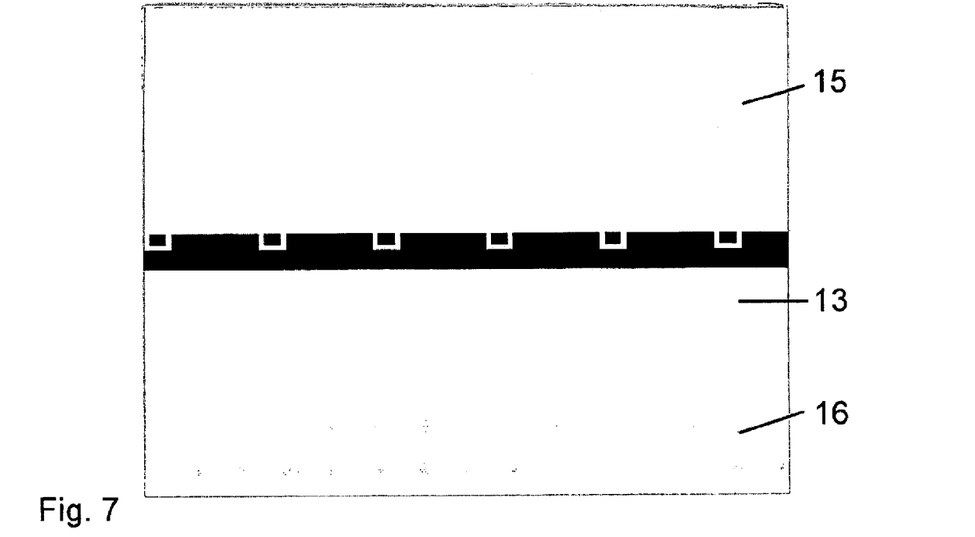

Contact surfaces 15 and 16, as shown in FIG. 7, are now applied on the structure shown in FIG. 6 and contact the regions 12b, 12c of the conductive layer 12 via the openings 14a, 14c in the dielectric layer 13. Since the openings 14c are disposed only above gate contacts and the contact surface 16 extends only over the openings 14c, the contact surface 16 has the function of a gate contact. Correspondingly, the contact surface 15 extends only over openings 14a so that they only contact the regions 12b of the conductive layer 12. These regions 12b have the function of a source contact, therefore the contact surface 15 also has the function of a source contact. The contact surfaces 15 and 16 are separated from each other electrically.

Figure 8:
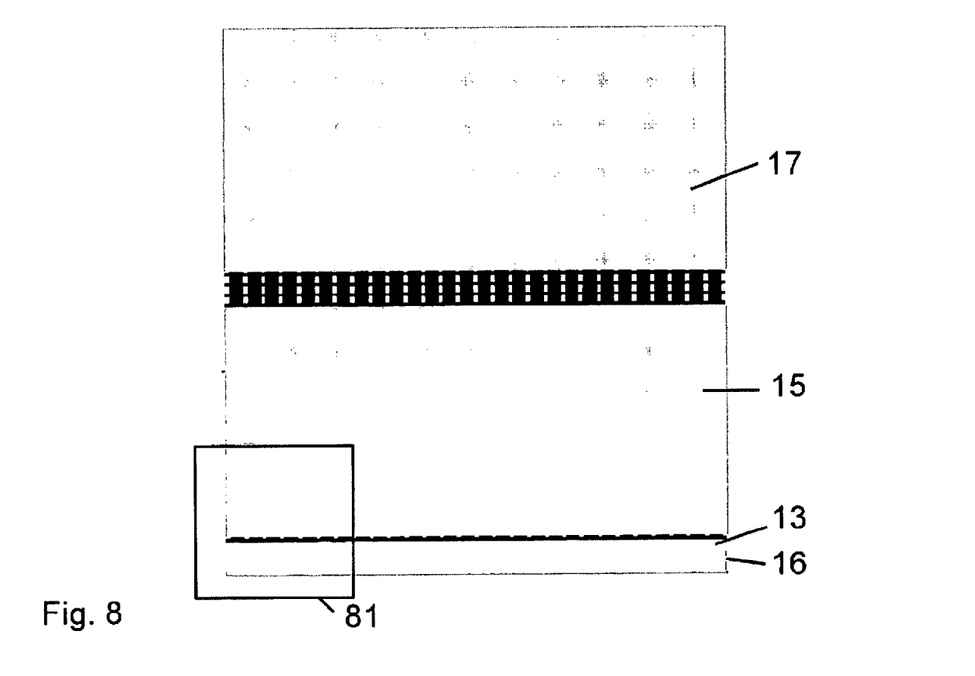

FIG. 8 shows a total view of the component from which FIGS. 1 to 7 reproduced the layer-wise structure of the section 81. The rectangular contact surfaces 15, 16 and 17 can be detected here, the contact surface 15 in turn having the function of a source contact, the contact surface 16 the function of a gate contact. The contact surface 17 has the function of a drain contact since, which is not shown here, it contacts the drain contact points 4 of the semiconductor component configured on the substrate. The 70 individual cells of the underlying component are covered in this Figure by the contact surfaces 15, 16, 17. A specific spacing which is smaller between gate- and source contact than between source- and drain contact is opened between the individual contacts. It should be noted that, in this example, the contact surfaces 15, 16 and 17 respectively contact in common all of the contacts 3, 4, 5a, 5b respectively of one function.

If merely the openings or via contacts are regarded in FIGS. 1 to 7, then the openings or via contacts, in plan view, are offset relative to each other at a defined spacing. This has the point that the process technology undergoes no great height differences.

Figure 9:
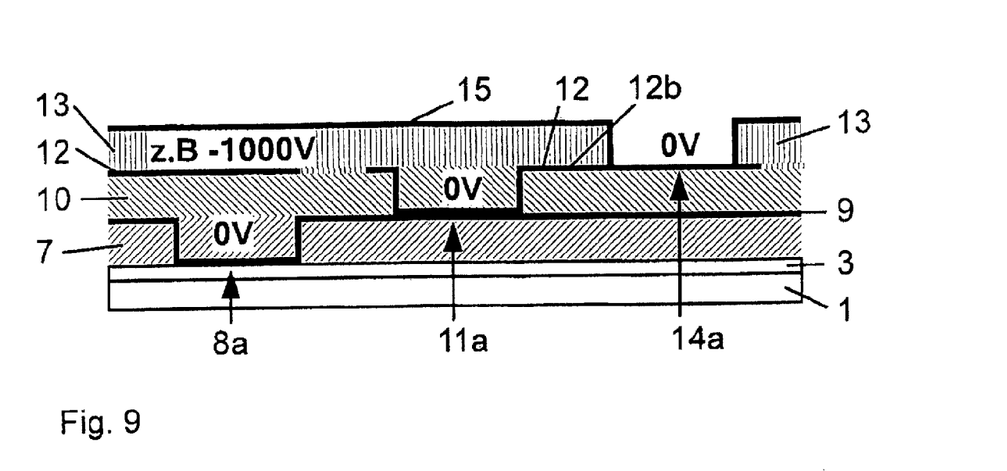

FIG. 9 shows the section through a semiconductor component, as is shown in FIGS. 1 to 8, with an interface perpendicular to the drawing plane of FIGS. 1 to 8. Right at the bottom is the semiconductor substrate 1 on which a source contact point 3 is disposed. The first insulating layer 7 (e.g., a dielectric layer) in which the opening 8a is introduced is disposed hereon. The first conductive layer or metallization 9 is applied on this first insulating layer 7 and extends over the first insulating layer 7 and into the opening 8a so that it contacts the source contact 3 electrically. The first insulating layer 7 will be described below as the dielectric layer 7.

On the conductive layer 9, the second insulating layer (e.g., a dielectric layer) 10 which has the opening 11a is disposed. The second insulating layer will be described below as the dielectric layer 10. The second conductive layer 12 is now applied on this second dielectric layer 10, the region 12b of the second conductive layer 12 extending into the opening 11a such that the region 12b is in electrical connection with the conductive layer 9. In the illustrated case, the conductive layer 12 or the region 12b in the region of the opening 11a is deposited on the layer 9. Then the third insulating layer 13 (e.g., a dielectric layer) which has the opening 14a is disposed on the second conductive layer 12. The third insulating layer will be described below as the dielectric layer 13. On this third dielectric layer 13, the contact surface 15 is then configured and contacts the conductive layer 12 or the region 12b thereof electrically through the opening 14a. In this way, by deposition of the dielectric layers 7, 10 and 13 and also the conductive layers 9, 12, and 15, a large-area contact 15 with the source contact 3 is produced. The sectional pictures appear correspondingly for the drain- and gate contact.

The illustrated electrical circuits can be produced analogously for example with diodes. The illustrated electrical circuits and the substrates thereof are rectangular here. Furthermore, also the contact surfaces are rectangular here. Alternatively, the substrate and the electrical circuit can for example also be circular, the contact surfaces then also being able to be configured as circular area sectors. The substrate 1 can have or comprise for example nitrides of main group III. The conductive layers can for example be metal layers. The illustrated contact points 3, 4, 5a, 5b have an oblong configuration here, parallel to each other and straight. It is however also possible that these contact points are for example annularly closed. The insulating layer can be a standard dielectric, such as for example $SiO_2$ or SiN, however also suitable polymer compounds, such as for example BCB (benzocyclobutene). The dielectric layers 7, 10, the conductive layers 9, 12 and/or the contact surfaces can be coated in coating methods on the layer situated respectively thereunder. The openings in the dielectric layers can be etched or structured. In order to produce the conductive layers, these openings can then be structured and metallised over a large area.

The invention claimed is:

1. An electrical circuit, comprising:
   a substrate which extends in one plane;
   a first layer spanning over a defined area of the substrate;
   a second layer arranged over the first layer spanning over the defined area;
   an insulating layer arranged between the first and second layers spanning over the defined area;
   a plurality of unit cells arranged adjacently on the first layer each having first, second, and third contact points;
   first, second and third contact surfaces insulated from each other and arranged on the second layer together covering the second layer substantially completely; and
   a plurality of openings arranged in the insulating layer providing through-contacting to connect the first, second, and third contact surfaces to the first, second, and third contact points of the unit cells,
   wherein the first contact surface is connected to the first contact point of each unit cell, the second contact surface is connected to the second contact point of each unit cell, and the third contact surface is connected to the third contact point of each unit cell.

2. The electrical circuit according to claim 1, wherein the unit cells are diodes.

3. The electrical circuit according to claim 1, wherein the unit cells are transistors with a source contact point, a drain contact point and a gate contact point, wherein the first contact point is the drain contact point, the second contact point is the source contact point, and the third contact point is the gate contact point.

4. The electrical circuit according to claim 3, wherein the transistors are field effect transistors.

5. The electrical circuit according to claim 1, wherein the insulating layer comprises:
   first, second and third dielectric layers spanning over the defined area;
   a first conducting layer in between the first and second dielectric layers; and
   a second conducting layer in between the second and third dielectric layers,
   wherein the first conducting layer comprises multiple regions insulated from each other and the second conducting layer comprises further multiple regions insulated from each other,
   wherein the openings provide through-contacting to contact the first contact points to the first conducting layer and to contact the second contact points to the second conducting layer and to contact the first conducting layer to the first contact surface, the second conducting layer to the second contact surface, and the third contact points to the third contacting surface.

6. The electrical circuit according to claim 1, wherein the contact points are at least one of oblong and parallel to each other.

7. The electrical circuit according to claim 1, wherein the contact points are configured annularly closed.

8. The electrical circuit according to claim 1, wherein the contact points are disposed on the substrate parallel to the latter.

9. The electrical circuit according to claim 1, wherein the substrate is one of electrically conductive and semiconducting.

10. The electrical circuit according to claim 1, wherein at least one of the openings in at least one of the dielectric layers has an oblong configuration.

11. The electrical circuit according to claim 1, wherein at least one of the openings in at least one of the dielectric layers has an oblong configuration partly parallel to each other.

12. The electrical circuit according to claim 1, wherein the unit cells are disposed on a circular-shaped area substrate, wherein the contact points are configured at least partially as portions of circular rings and wherein the contact surfaces are configured as sectors of a circular area which is disposed with essentially the same dimensions as the substrate parallel to the latter.

13. The electrical circuit according to claim 1, wherein the unit cells are disposed on a circular-shaped area substrate, wherein the contact points are configured at least partially as portions of circular rings and wherein the contact surfaces are configured as one of half sectors and third sectors of a circular area which is disposed with essentially the same dimensions as the substrate parallel to the latter.

14. The electrical circuit according to claim 1, wherein there is one contact surface for each function.

15. The electrical circuit according to claim 1, wherein at least one of the contact surfaces has at least one bonding spot contacting a contact surface for contacting the electrical circuit using at least one bonding wire.

16. The electrical circuit according to claim 15, wherein at least one of the bonding spot and the bonding wire are disposed on an upper side of the corresponding contact surface orientated away from the unit cells.

17. The electrical circuit according to claim 1, wherein at least one contact point of a different function is disposed directly adjacent to at least some of the contact points of one function.

18. The electrical circuit according to claim 1, wherein all of the contact points of one function are disposed directly adjacently.

19. The electrical circuit according to claim 1, wherein all of the contact points of one function are disposed directly adjacently via an insulation.

20. The electrical circuit according to claim 17, wherein the electrical circuit is configured such that, during an operation mode, a current flows only through contacts of some functions at the same time.

21. The electrical circuit according to claim 20, wherein the electrical circuit is configured such that, during an operation mode, a current flows only through contacts of one function at the same time.

22. The electrical circuit according to claim 1, wherein the electrical circuit is a half H-bridge with at least two transistors, a source contact of a first transistor being contacted electrically with a drain contact of a second transistor, and the contact points having the functions: drain of the first transistor, source of the second transistor, gate of the first transistor and gate of the second transistor.

23. The electrical circuit according to claim 1, wherein the electrical circuit is a half H-bridge with at least two transistors, a source contact of a first transistor being directly contacted electrically with a drain contact of a second transistor, and the contact points having the functions: drain of the first transistor, source of the second transistor, gate of the first transistor and gate of the second transistor.

24. The electrical circuit according to claim 22, wherein the adjacently disposed contact points are source contacts of the second transistor and drain contacts of the first transistor.

25. The electrical circuit according to claim 1, wherein at least one of the unit cells includes a semiconductor, the semiconductor comprising at least one nitride of at least one main group III element.

26. The electrical circuit according to claim 1, wherein at least one of the unit cells includes a semiconductor, the semiconductor comprising at least one of GaN, AlN, InN, AlGaN, InGaN, AlInN and AlGaInN.

27. A semiconductor component, comprising:
an electrical circuit including:
- a substrate which extends in one plane;
- a first layer spanning over a defined area of the substrate;
- a second layer arranged over the first layer spanning over the defined area;
- an insulating layer arranged between the first and second layers spanning over the defined area;
- a plurality of unit cells arranged adjacently on the first layer each having first, second, and third contact points;
- first, second, and third contact surfaces insulated from each other and arranged on the second layer together covering the second layer substantially completely; and
- a plurality of openings arranged in the insulating layer providing through-contacting to connect the first, second, and third contact surfaces to the first, second, and third contact points of the unit cells, wherein the first contact surface is connected to the first contact point of each unit cell, the second contact surface is connected to the second contact point of each unit cell, and the third contact surface is connected to the third contact point of each unit cell.

* * * * *